(12) United States Patent
Eddlemon

(10) Patent No.: US 6,496,068 B1
(45) Date of Patent: Dec. 17, 2002

(54) MULTI-STAGE AMPLIFIER CIRCUIT

(75) Inventor: Dennis Eddlemon, Tucson, AZ (US)

(73) Assignee: Apex Microtechnology Corporation, Tucson, AZ (US)

( * ) Notice: Subject to any disclaimer, the term of this patent is extended or adjusted under 35 U.S.C. 154(b) by 38 days.

(21) Appl. No.: 09/712,733

(22) Filed: Nov. 14, 2000

Related U.S. Application Data

(60) Provisional application No. 60/165,951, filed on Nov. 17, 1999.

(51) Int. Cl.⁷ .................................................. H03F 3/18
(52) U.S. Cl. ........................ 330/263; 330/264; 330/265; 330/267
(58) Field of Search ................................. 330/263, 264, 330/265, 267

(56) References Cited

U.S. PATENT DOCUMENTS

| | | |
|---|---|---|
| 3,886,466 A | 5/1975 | Wheatley, Jr. ............... 330/15 |
| 3,934,209 A | 1/1976 | Valentine et al. ............. 330/18 |
| 3,995,228 A * | 11/1976 | Pass ............................. 330/13 |
| 4,453,134 A | 6/1984 | Pernyeszi .................... 330/255 |
| 4,667,165 A | 5/1987 | De Weck ..................... 330/253 |
| 4,697,155 A | 9/1987 | Lehning ...................... 330/297 |
| 4,701,718 A | 10/1987 | Wrathall et al. ............ 330/253 |
| 5,233,289 A | 8/1993 | Beasom ....................... 323/313 |
| 5,754,078 A | 5/1998 | Tamagawa ................... 330/255 |
| 5,786,731 A | 7/1998 | Bales .......................... 330/267 |
| 6,163,220 A | 12/2000 | Schellenberg ............... 330/295 |

* cited by examiner

Primary Examiner—Michael B Shingleton
(74) Attorney, Agent, or Firm—Hayes Soloway P.C.

(57) ABSTRACT

An amplifier circuit that includes an amplifier stage and an output stage, and local feedback between these stages to drive a biasing string associated with the amplifier stage using the potential at the output stage. In one embodiment, the local feedback line is coupled between the output stage and the biasing string to remove the loading effect of the biasing string on the amplifier stage. In another embodiment, the local feedback line is coupled between the switches of the amplifier stage and the switches of the output stage to bias the amplifier stage using the output stage.

34 Claims, 4 Drawing Sheets

US 6,496,068 B1

MULTI-STAGE AMPLIFIER CIRCUIT

This application claims benefit of provisional application No. 60/165,951 filed Nov. 17, 1999.

FIELD OF THE INVENTION

The present invention relates to the field of electronics and power operational amplifiers and, more specifically, to the variety of power operational amplifiers that are described as high voltage power operational amplifiers.

DESCRIPTION OF RELATED ART

In Prior Art FIGS. 1 and 2 and also in FIGS. 3 and 4, which illustrate the invention, multiple amplifier stages that represent the second stage and the output stage of an operational amplifier are illustrated. Node 2 is a signal from the differential input stage of the operational amplifier. The input stage design is well understood by those skilled in the art and is not required for understanding of the present invention, and is so omitted. The second stage is labeled as such because it is very common in the design of operational amplifiers to have three stages: a differential input stage, a second stage and an output stage. Each of the figures also shows several MOSFET transistors stacked vertically drain-to-source between the positive supply voltage and the negative supply voltage. Although a total of four MOSFETs are shown stacked in each stage, the description herein could equally be applied to stacks of any number. Also, although the figures and explanations apply to MOSFET transistor amplifier designs, the techniques are not limited to this type of technology. Similar circuits could be demonstrated with bipolar transistors, for example.

In Prior Art FIG. 1, four resistors, R1, R2, R3, and R4 are connected in series across the power supply voltages. Although all the resistors need not be equal in value, they will be assumed to be for explanation purposes. For the illustration of circuit operation the positive and negative supply voltages are assumed to be +400V and −400V respectively. However, the supply voltages could be any desired value, as the circuit would still operate in a similar fashion. Also, it is noted that Q7 in the figures is a type of transistor known as a depletion mode MOSFET and that it is connected as a current source. The exact nature of the current source is not important for circuit operation, but there needs to be a current source at the Q7 location. Typically a transistor of similar type to the others is used in most designs. R1, R2, R3 and R4 along with capacitors C1, C2, C3 and C4 (to be discussed later) will hereinafter be referred to as "the biasing string".

Assuming equal resistor values, each resistor will have ¼ of the total supply voltage dropped across it. Since little or no current flows into the gate terminal of a MOSFET transistor +200V will appear on the gate of Q3, zero volts at circuit node 6, and −200V will appear on the gate of Q5 (all with respect to ground, of course). These biasing voltages force the source terminal of Q3 to be approximately +200V as well since only a few volts of bias voltage from gate to source is required to operate a MOSFET. Similarly the source of Q5 is required to be about +200V. It is evident that the bias applied by the four resistors is approximately reflected in the drain-source voltages of Q1, Q3, Q5 and Q7.

Note that in an operational amplifier some feedback is applied from the output to the differential stage input. If the differential stage input signal is set to zero volts then the output voltage will be at zero volts as well (neglecting offset errors). For simplicity all of the figures do not show the output connected to a feedback network. The terminal labeled "input" is a signal that comes from the previously mentioned differential input stage that would be required to complete an operational amplifier design. In each figure, the schematic should be assumed to be merely a portion of that overall design.

Referring again to Prior Art FIG. 1, if the differential input stage (not shown) were to command the output (via the input terminal) to move to +50V then node 6 would have to move to +50V plus whatever gate-source voltage would be required to operate Q4. As the output moves, node 6 is pushed to a corresponding voltage. Suppose, for example, the output moves to +350V. Node 6 will follow to approximately the same voltage. R3, R4 divides that voltage and as previously explained Q5 and Q7 will now have approximately equal voltages distributed across each from drain to source (175V). Suppose further that the transistors used in this example had a breakdown voltage of only 200V. With this technique a total voltage supply of 400V could be used.

This technique works well in many applications. However, there is an important limitation. So far, the values of resistors R1–R4 have not been considered. In principle, any value could be used. However, the lower the value, the higher the biasing current requirement of the power supplies. This biasing current increases the overall power consumption of the circuit and does not contribute to the output. Higher power supply currents at higher supply voltages are expensive. Consequently, R1–R4 is usually set to a value of 1 meg-ohm, or more.

Therein lies the major limitation of this circuit. As the output moves, charge must move into or out of the gate circuits of Q3 and Q5. If the values of R1–R4 are high, this cannot be done quickly because of the time constants formed by the capacitance seen at the gates of the transistors and the values of the resistors. For example, if a signal at the input terminal quickly drives the gate of Q1 more negative (Q1 more on), Q's drain-source voltage will quickly decrease. If the gate voltage on Q3 cannot quickly follow that voltage change, the voltage that should be equally divided across Q3 and Q1 will mostly appear across Q3. This unequal distribution of voltage will destroy Q3 since its breakdown voltage will be exceeded. An unequal distribution of voltage across output transistors Q2 and Q4 will also result, with the same damaging effects.

Prior Art FIG. 2 shows a method to improve the speed of operation of the circuit compared to FIG. 1. In FIG. 2 capacitors C1, C2, C3 and C4 are added to the biasing string. The capacitors allow more charge to dynamically move in and out of the gate circuits in less time than would otherwise be possible without them, as discussed above when considering Prior Art FIG. 1. This method is an improvement but not without problems as well. The same capacitors that improve the circuit also build in a limitation. Using small signal AC analysis of node 6, capacitors C1, C2, C3 and C4 appear as an equivalent capacitor from node 6 to ground. The equivalent capacitor rolls off the high frequency response of the second stage, thus limiting the bandwidth of the amplifier. That capacitance is charged by the current source Q7. Current that charges the equivalent capacitor is not then available to charge other capacitance in the stage. Thus, these capacitors also limit the slew rate of the amplifier since current available to charge these capacitances is what sets the slew rate of the amplifier.

Further, as node 6 moves more negative, the current required by R1 and R2 in the divider increases since the voltage drop across them increases. That current comes from current source Q7. That leaves less current to charge the equivalent capacitance on node 6 further limiting the slew rate of the amplifier.

Accordingly, conventional operational amplifiers suffer from unbalanced distribution of voltages, for example, due to increased time constants or limited slew rates. Additionally, conventional amplifier circuits provide inefficient power (current) consumption, since these effects are not taken into design considerations Thus, there exists a need to provide an operational amplifier having more efficient power considerations, as well as, increased slew rate and increased speed.

SUMMARY OF THE INVENTION

Accordingly, the present invention provides an improved means to bias a second stage and an output stage where the total supply voltage exceeds the breakdown voltage of the individual transistors used to build the several stages of the amplifier. In Prior Art FIGS. 1 and 2 existing methods are shown to distribute the supply voltages across several transistors which are stacked drain-to-source in a serial arrangement so as to increase the total breakdown voltage of the amplifier. The problems with the Prior Art models relating to the rate at which the amplifier's signal can change without causing unequal distribution of voltages across the individual transistors will be discussed, and it will be shown how the present invention solves this problem.

In one embodiment the present invention provides an amplifier circuit comprising: a positive supply rail and a negative supply rail; a first plurality of switches stacked between said positive and negative supply rails, a biasing string comprising a plurality of RC circuits stacked between said positive and negative supply rails, one of said switches receiving an external control signal to control the conduction state thereof, another of said switches being arranged as a current source; a second plurality of switches stacked between said positive and negative supply rails the conduction state thereof being controlled by the conduction state of said first plurality of switches; and a feedback line from said second plurality of switches to said biasing string operable to drive said plurality of RC circuits using power from said second plurality of switches.

In a second embodiment the present invention an amplifier circuit comprising a positive supply rail and a negative supply rail; a first plurality of switches stacked between said positive and negative supply rails, a biasing string comprising a plurality of RC circuits stacked between said positive and negative supply rails, one of said switches receiving an external control signal to control the conduction state thereof, another of said switches being arranged as a current source; a second plurality of switches stacked between said positive and negative supply rails the conduction state thereof being controlled by the conduction state of said first plurality of switches; and a feedback line from said second plurality of switches to said first plurality of switches to bias said first plurality of switches with said second plurality of switches.

In broader aspects, the present invention provides an amplifier circuit, comprising an input stage operable to produce a differential input signal; a second stage operable to amplify said input signal; an output stage operable to deliver said amplified signal to a load; and a local feedback line between said output stage and said second stage, said feedback line operable to bias said second stage with the potential of said output stage.

The present invention also includes methods to amplify a signal, comprising the steps of: passing an input signal through an amplifier stage comprising a plurality of first switches stacked between positive and negative power supply rails; controlling the conduction state of said first switches to amplify and pass said signal to an output stage comprising a plurality second switches stacked between said positive and negative power supply rails; providing a local feedback line between said amplifier stage and said output stage so that said output stage controls the biasing of said amplifier stage.

Other features and advantages of the present invention will become apparent as the following Detailed Description proceeds, and upon reference to the Drawings, wherein like numerals depict like parts, and wherein:

DETAILED DESCRIPTION OF THE EXEMPLARY EMBODIMENTS

Figure 2:
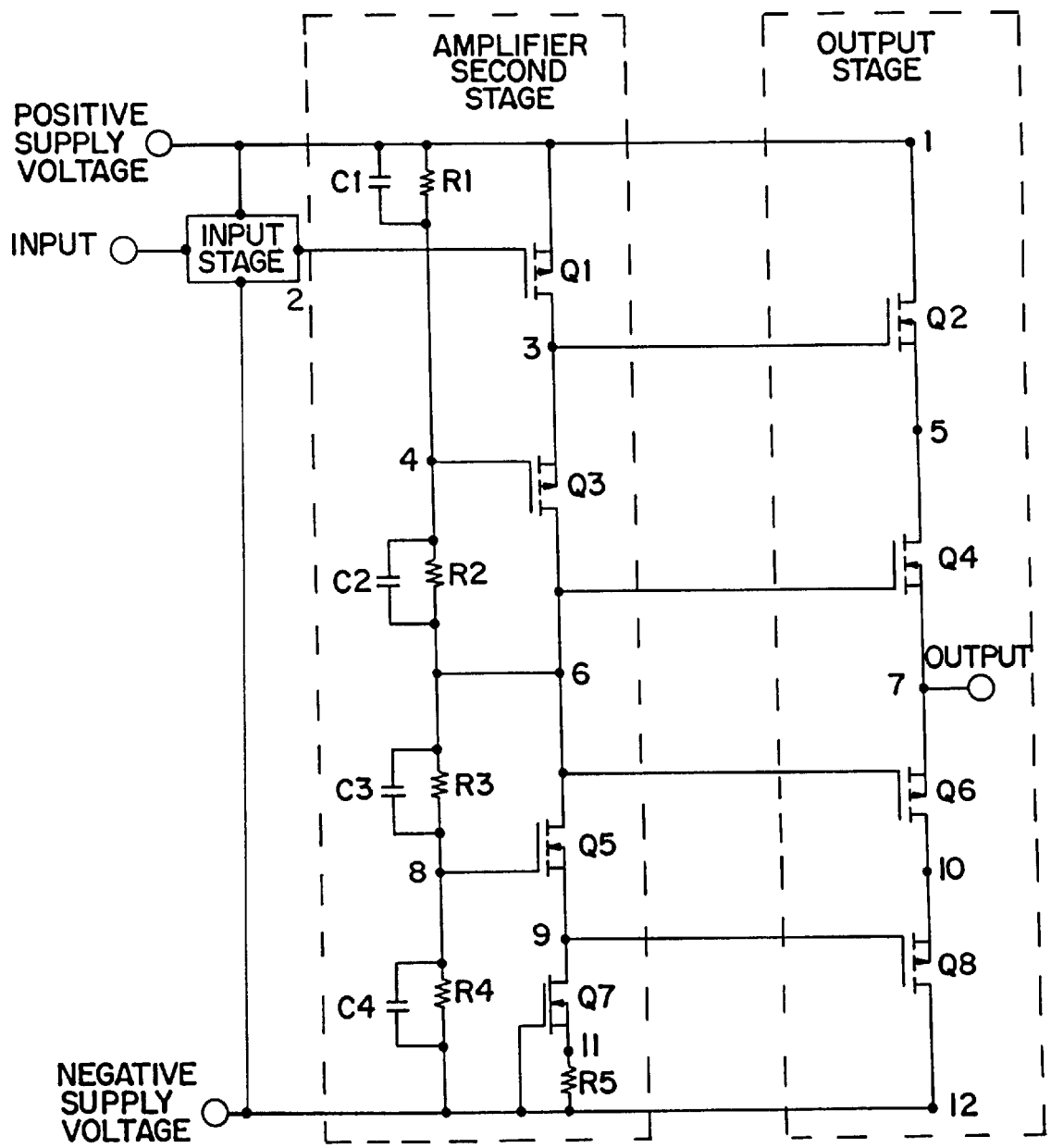
FIG. 2 is another example of a conventional second stage and output stage of an operational amplifier of the prior art.
Figure 3:
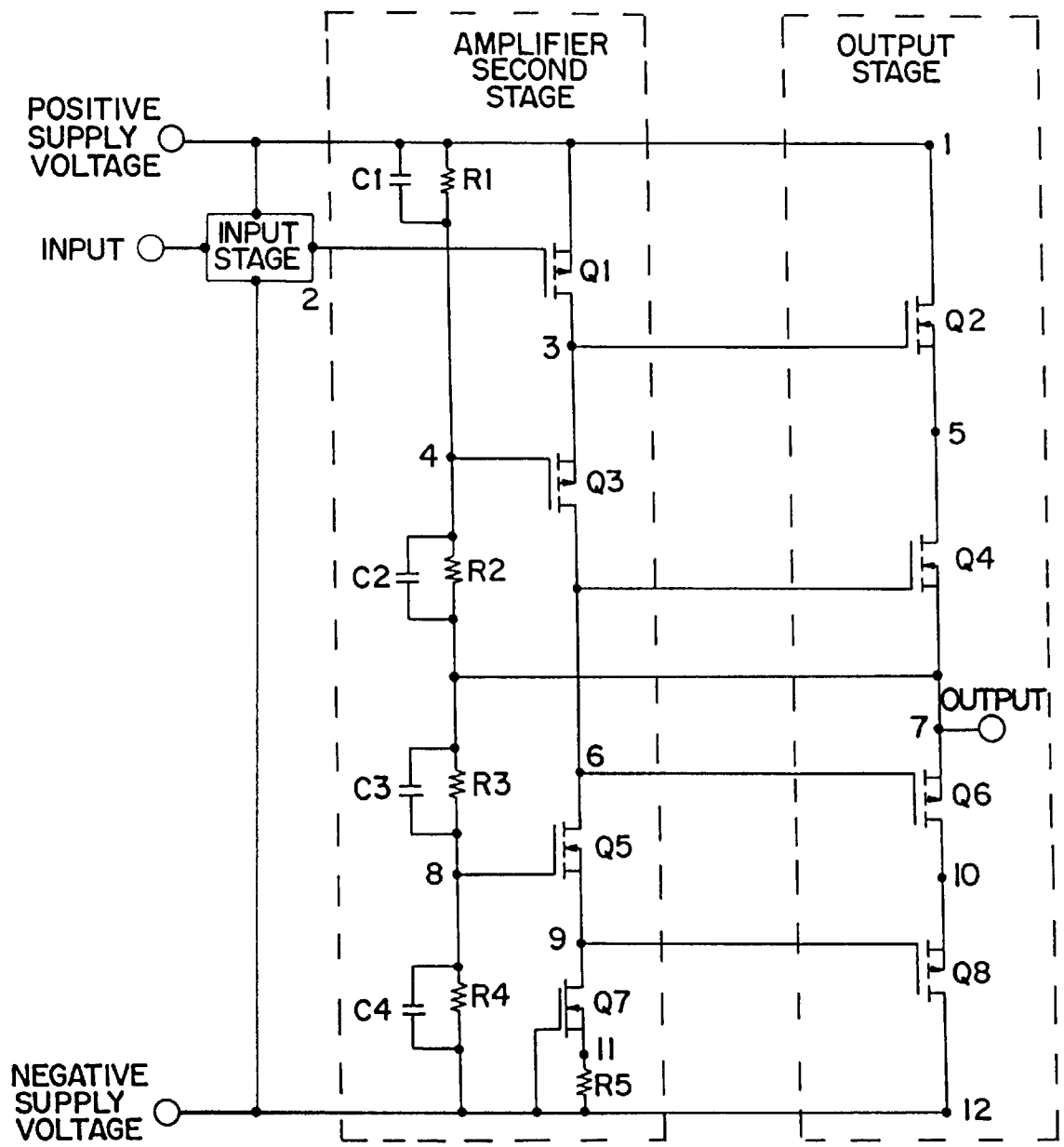
FIG. 3 is a preferred embodiment of the operational amplifier of the present invention.

FIG. 3, illustrating one embodiment of the invention, eliminates all of the aforementioned negative effects, while maintaining the benefits of C1, C2, C3 and C4. In FIG. 2, node 6 is connected to the junction of resistors R2 and R3. In FIG. 3, however, the junction of resistors R2 and R3 is now connected to the output node 7.

Using this circuit topology of FIG. 3, the biasing string is removed as a load on the second stage. Since the equivalent capacitance at node 6 of FIG. 2 is now gone, so is that limitation on small signal bandwidth and slew rate. Additionally, since the biasing string is driven by the output stage, the current from current source Q7 is no longer steered into the biasing string as node 6 moves (i.e., changes value). This ensures that a constant slew rate is obtained as the output signal slews over its entire range. Moreover, local feedback is created between the output stage and the second stage, thus controlling the biasing of the second and output stages. For example, the biasing of the output stage is controlled by the biasing of the second stage, which is controlled by the biasing string that in turn is controlled by the output. This completes the feedback loop.

Figure 1:
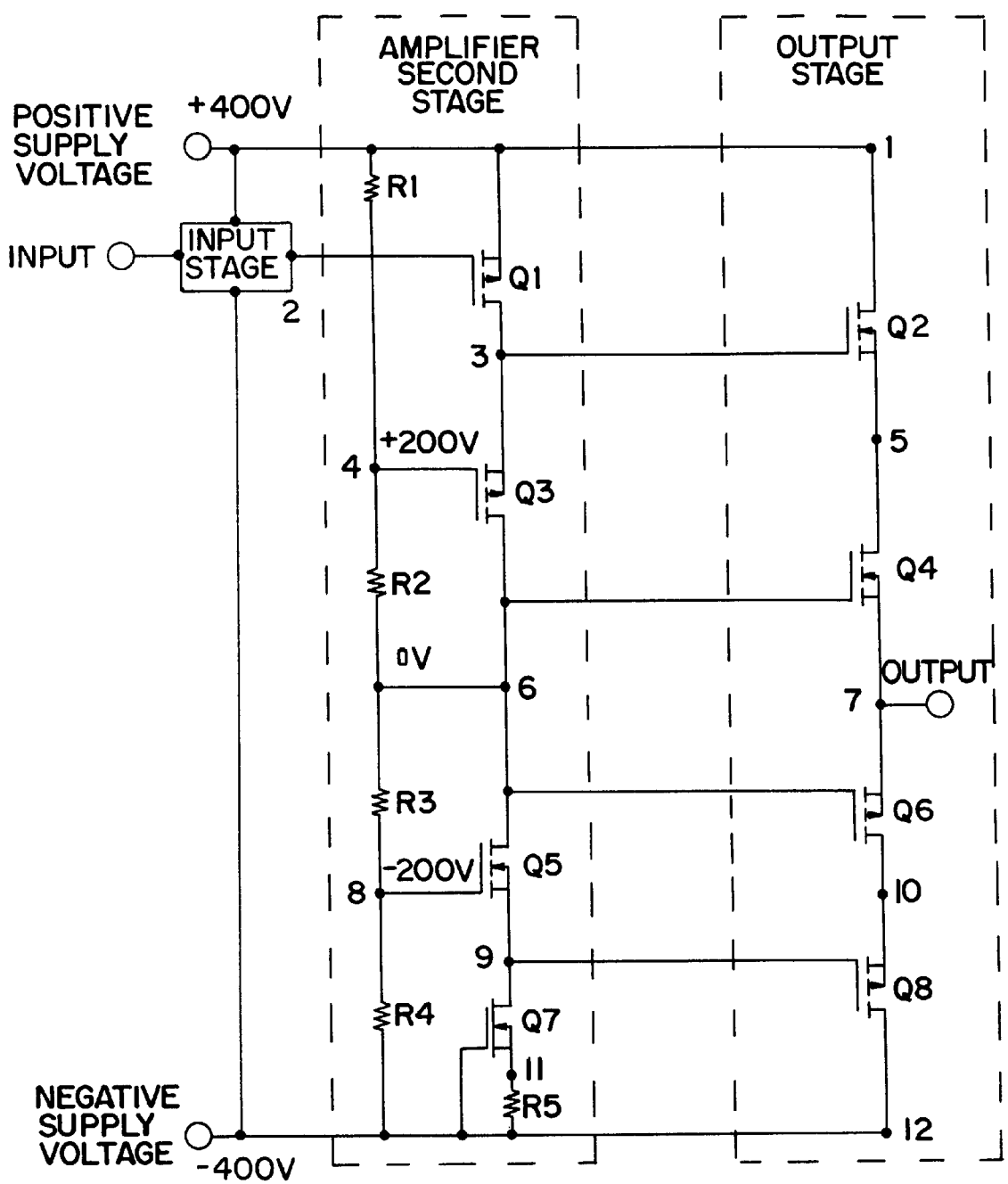
FIG. 1 is one example of a conventional second stage and output stage of an operational amplifier of the prior art.
Figure 4:
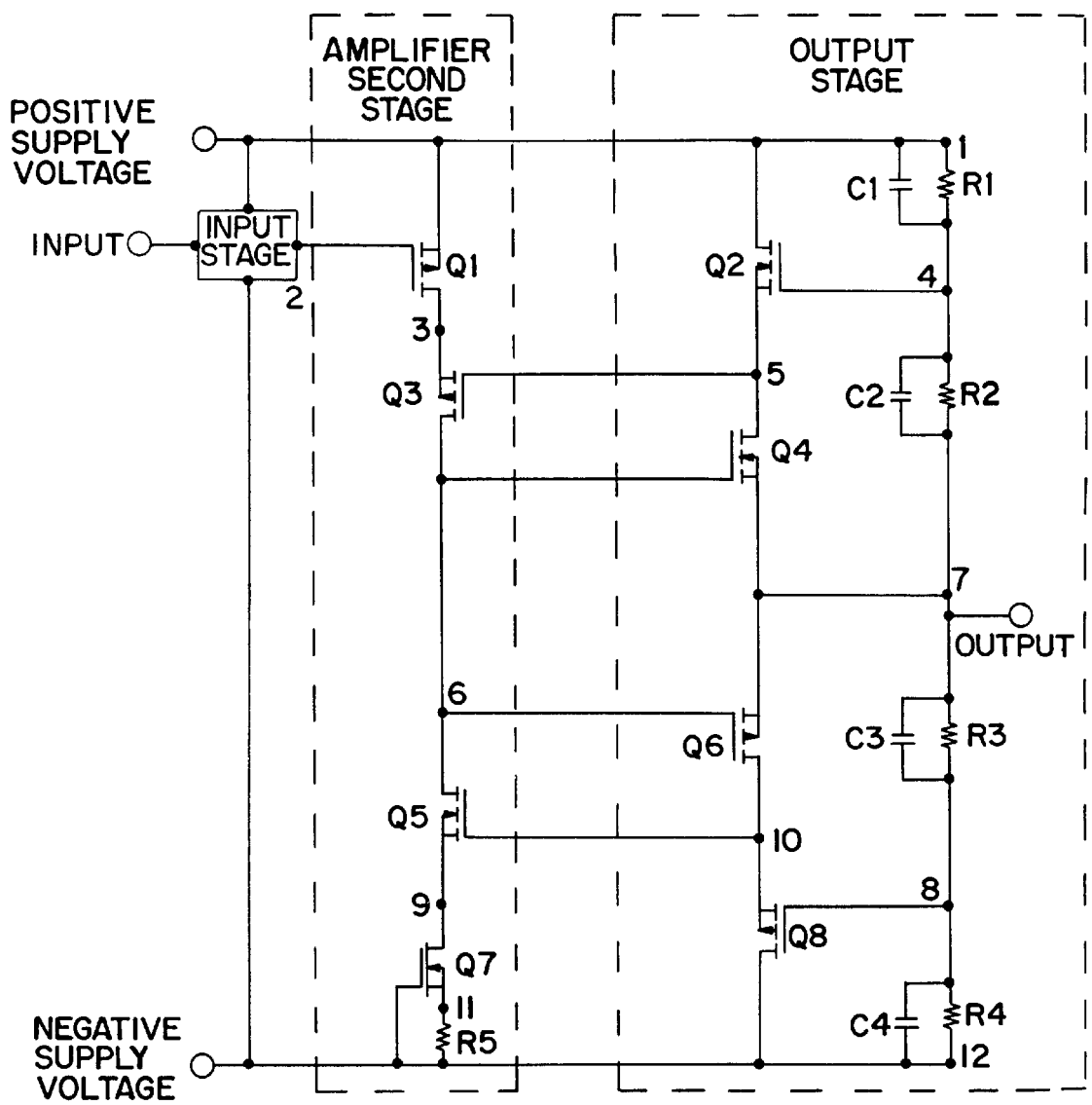
FIG. 4 is another embodiment of the operational amplifier of the present invention.

FIG. 4 is another circuit that also overcomes the limitations of the Prior Art of FIGS. 1 and 2, but as opposed to the circuit of FIG. 3, there is no overall local feedback to control all the biasing of the two stages. The biasing string now is connected across the output stage. Preferably, all the resistors are the same value. As node 7 moves, the voltage between node 7 and either supply voltage is divided by two (at nodes 4 and 8). Since only a few volts is necessary to operate a MOSFET similar voltages are found on nodes 5 and 10 respectively. Consequently, approximately half of the voltage between either supply voltage and the output is dropped across either transistor pair Q2, Q4 or Q6, Q8. Again because only a few volts is required to bias a MOSFET, the second stage is biased by the voltages generated by the output stage.

It should be noted that no special manufacturing processes or techniques are needed to implement the ideas of the invention. The invention could be equally well implemented in chip and wire hybrid circuits, surface mount designs with packaged transistors as well as dielectrically isolated monolithic designs.

Modifications to the present invention are possible. For example, although the circuit diagrams depicted herein consist of four vertically stacked transistors, the present invention can be appropriately modified with any number of additional transistors. With such a modification, those skilled in the art will recognize that the voltage division between the biasing resistors will need to be adjusted so that the local feedback node 7 in FIG. 3 is placed in the appropriate position for the number of transistors in the stack. Likewise, FIG. 4 would need additional RC arrangements for each additional transistor in the stack. Other modifications are possible. For example, as noted above, the resistor values need not be equal, but may instead provide an unbalanced voltage division between the rails. Those skilled in the art will recognize that other modifications are possible, and all such modifications are deemed within the spirit and scope of the present invention.

What is claimed is:

1. An amplifier circuit comprising:

a positive supply rail and a negative supply rail;

a first plurality of switches stacked between said positive and negative supply rails, a biasing string comprising a plurality of RC circuits stacked between said positive and negative supply rails, one of said switches receiving an external control signal to control the conduction switches; and a feedback line from said second plurality of switches to said biasing string operable to drive said plurality of RC circuits using power from said second plurality of switches;

wherein said first plurality of switches comprises a first, second, third and fourth switch arranged in a series stacked relationship between said positive and negative supply rails, said first switch receiving said control signal to control the conduction state thereof and coupled to said positive supply rail, and said fourth switch configured to operate as a current source wherein the conduction state thereof is controlled by said negative supply rail, said switches defining a first node between said first and second switch, a second node between said second and third switch, and a third node between said third and fourth switch;

wherein said biasing string comprises a first, second, third and fourth parallel arrangement of said RC circuits arranged in a series stacked relationship between said positive and negative supply rails, said RC circuits dividing the potential between said positive and negative supply rails and defining a fifth node between said first and second RC circuits and a sixth node between said third and fourth RC circuits, the potential at said fifth node controlling the conduction state of said second switch, the potential at said sixth node controlling the conduction state of said third switch.

2. An amplifier circuit as claimed in claim 1, wherein said second plurality of switches comprises a fifth, sixth, seventh and eighth switch arranged in a series stacked relationship between said positive and negative supply rails, wherein the conduction state of said fifth switch is controlled by the potential of said first node, the conduction state of said sixth and seventh switches is controlled by the potential of said second node, and the conduction state of said eighth switch is controlled by the potential of said third node.

3. An amplifier circuit comprising:

a positive supply rail and a negative supply rail;

a first plurality of switches stacked between said positive and negative supply rails, a biasing string comprising a plurality of RC circuits stacked between said positive and negative supply rails, one of said switches receiving an external control signal to control the conduction state thereof, another of said switches being arranged as a current source;

a second plurality of switches stacked between said positive and negative supply rails, the conduction state there of being controlled by the conduction state of said first plurality of switches; and a feedback line from said second plurality of switches to said biasing string operable to drive said plurality of RC circuits using power from said second plurality of switches;

wherein the potential between said positive and negative rails is divided substantially equally between said RC circuits.

4. An amplifier circuit comprising:

a positive supply rail and a negative supply rail;

a first plurality of switches stacked between said positive and negative supply rails, a biasing string comprising a plurality of RC circuits stacked between said positive and negative supply rails, one of said switches receiving an external control signal to control the conduction state thereof, another of said switches being arranged as a current source;

a second plurality of switches stacked between said positive and negative supply rails, the conduction state thereof being controlled by the conduction state of said first plurality of switches; and a feedback line from said second plurality of switches to said biasing string operable to drive said plurality of RC circuits using power from said second plurality of switches;

wherein said feedback line is operable to remove said plurality of RC circuits as a load to said first plurality of switches.

5. An amplifier as claimed in claim 1, wherein the potential between said positive and negative rails is divided substantially equally between said first, second, third and fourth parallel arrangement of said RC circuits, and said feedback line is coupled between said sixth and seventh switches and said second and third RC circuits.

6. An amplifier as claimed in claim 5, wherein said feedback line is operable as an output line to said amplifier.

7. An amplifier circuit, comprising:

an input stage operable to produce a differential input signal;

a second stage operable to amplify said input signal;

an output stage operable to deliver said amplified signal to a load; and a local feedback line between said output stage and said second stage, said feedback line operable to bias said second stage with the potential of said output stage;

wherein said second stage comprises a first plurality of switches stacked between positive and negative supply rails, a biasing string comprising a plurality of RC circuits stacked between said positive and negative supply rails, one of said switches receiving an external control signal to control the conduction state thereof, another of said switches being arranged as a current source; and wherein said output stage comprises a second plurality of switches stacked between said positive and negative supply rails, the conduction state thereof being controlled by the conduction state of said first plurality of switches.

8. An amplifier circuit as claimed in claim 7, wherein said first plurality of switches comprises a first, second, third and fourth switch arranged in a series stacked relationship between said positive and negative supply rails, said first switch receiving said control signal to control the conduction state thereof and coupled to said positive supply rail, and said fourth switch configured to operate as a current source wherein the conduction state thereof is controlled by said negative supply rail, said switches defining a first node between said first and second switch, a second node between said second and third switch, and a third node between said third and fourth switch;

said biasing string comprising a first, second, third and fourth parallel arrangement of said RC circuits arranged in a series stacked relationship between said positive and negative supply rails, said RC circuits dividing the potential between said positive and negative supply rails and defining a fifth node between said first and second RC circuits and a sixth node between said third and fourth RC circuits, the potential at said fifth node controlling the conduction state of said second switch, the potential at said sixth node controlling the conduction state of said third switch.

9. An amplifier circuit as claimed in claim 8, wherein said second plurality of switches comprises a fifth, sixth, seventh and eighth switch arranged in a series stacked relationship between said positive and negative supply rails, wherein the conduction state of said fifth switch is controlled by the potential of said first node, the conduction state of said sixth and seventh switches is controlled by the potential of said second node, and the conduction state of said eighth switch is controlled by the potential of said third node.

10. An amplifier circuit as claimed in claim 9, wherein the potential between said positive and negative rails is divided substantially equally between said RC circuits, and said feedback line is coupled between said sixth and seventh switches and said second and third RC circuits.

11. An amplifier as claimed in claim 7, wherein said feedback line from said second plurality of switches to said biasing string is operable to drive said plurality of RC circuits using power from said second plurality of switches.

12. An amplifier as claimed in claim 7, wherein said switches comprise power MOSFET transistors.

13. An amplifier as claimed in claim 8, wherein said first and second switches comprise switches of a first conductivity type, and said third and fourth comprise switches of a second conductivity type.

14. An amplifier as claimed in claim 9, wherein said fifth and sixth switches comprise switches of a first conductivity type, and said seventh and eighth comprise switches of a second conductivity type.

15. An amplifier as claimed in claim 7, wherein each said resistor in said RC circuits has a substantially equal value so that the potential between said supply rails is divided substantially equally therebetween.

16. An amplifier as claimed in claim 7, wherein each said capacitor in said RC circuits has a substantially equal value.

17. An amplifier as claimed in claim 1, wherein said switches comprise power MOSFET transistors.

18. An amplifier as claimed in claim 1, wherein said first and second switches comprise switches of a first conductivity type, and said third and fourth comprise switches of a second conductivity type.

19. An amplifier as claimed in claim 2, wherein said fifth and sixth switches comprise switches of a first conductivity type, and said seventh and eighth comprise switches of a second conductivity type.

20. An amplifier as claimed in claim 1, wherein each said resistor in said RC circuits has a substantially equal value so that the potential between said supply rails is divided substantially equally therebetween.

21. An amplifier as claimed in claim 1, wherein each said capacitor in said RC circuits has a substantially equal value.

22. A method of amplifying a signal, comprising the steps of:

passing an input signal through an amplifier stage comprising a plurality of first switches stacked between positive and negative power supply rails;

controlling the conduction state of said first switches to amplify and pass said signal to an output stage comprising a plurality of second switches stacked between said positive and negative power supply rails;

providing a local feedback line between said amplifier stage and said output stage so that said output stage controls the biasing of said amplifier stage; and coupling a biasing string to said first plurality of switches to load said first plurality of switches.

23. A method of amplifying a signal, comprising the steps of:

passing an input signal through an amplifier stage comprising a plurality of first switches stacked between positive and negative power supply rails;

controlling the conduction state of said first switches to amplify and pass said signal to an output stage comprising a plurality of second switches stacked between said positive and negative power supply rails;

providing a local feedback line between said amplifier stage and said output stage so that said output stage controls the biasing of said amplifier stage; and dividing the potential between said power supply rails substantially equally between said first plurality of switches.

24. An amplifier circuit comprising:

a positive supply rail and a negative supply rail;

a first plurality of switches stacked between said positive and negative supply rails, a biasing string comprising a plurality of RC circuits stacked between said positive and negative supply rails, one of said switches receiving an external control signal to control the conduction state thereof, another of said switches being arranged as a current source;

a second plurality of switches stacked between said positive and negative supply rails, the conduction state thereof being controlled by the conduction state of said first plurality of switches; and a feedback line from said second plurality of switches to said first plurality of switches to bias said first plurality of switches with said second plurality of switches;

wherein said first plurality of switches comprises a first, second, third and fourth switch arranged in a series stacked relationship between said positive and negative supply rails, said first switch receiving said control signal to control the conduction state thereof and coupled to said positive supply rail, and said fourth switch configured to operate as a current source wherein the conduction state thereof is controlled by said negative supply rail, said switches defining a first node between said first and second switch, a second node between said second and third switch, and a third node between said third and fourth switch;

said biasing string comprising a first, second, third and fourth parallel arrangement of said RC circuits arranged in a series stacked relationship between said positive and negative supply rails, said RC circuits dividing the potential between said positive and negative supply rails and defining a fifth node between said first and second RC circuits and a sixth node between said third and fourth RC circuits, the potential at said fifth node controlling the conduction state of said second switch, the potential at said sixth node controlling the conduction state of said third switch.

25. An amplifier circuit as claimed in claim 24, wherein said second plurality of switches comprises a fifth, sixth, seventh and eighth switch arranged in a series stacked relationship between said positive and negative supply rails, wherein the conduction state of said fifth switch is controlled by the potential of said first node, the conduction state of said sixth and seventh switches is controlled by the potential of said second node, and the conduction state of said eighth switch is controlled by the potential of said third node.

26. An amplifier as claimed in claim 24, wherein the potential between said positive and negative rails is divided substantially equally between said first, second, third and fourth parallel arrangement of said RC circuits.

27. An amplifier as claimed in claim 24, wherein said feedback line is operable to remove said plurality of RC circuits as a load to said first plurality of switches.

28. An amplifier as claimed in claim 24, wherein the potential between said positive and negative rails is divided substantially equally between said first, second, third and fourth parallel arrangement of said RC circuits, and said feedback line is coupled between said sixth and seventh switches and said second and third RC circuits.

29. An amplifier as claimed in claim 28, wherein said feedback line is operable as an output line to said amplifier.

30. An amplifier as claimed in claim 24, wherein said switches comprise power MOSFET transistors.

31. An amplifier as claimed in claim 24, wherein said first and second switches comprise switches of a first conductivity type, and said third and fourth comprise switches of a second conductivity type.

32. An amplifier as claimed in claim 25, wherein said fifth and sixth switches comprise switches of a first conductivity type, and said seventh and eighth comprise switches of a second conductivity type.

33. An amplifier as claimed in claim 24, wherein each said resistor in said RC circuits has a substantially equal value so that the potential between said supply rails is divided substantially equally therebetween.

34. An amplifier as claimed in claim 24, wherein each said capacitor in said RC circuits has a substantially equal value.

* * * * *